United States Patent [19]
Magome et al.

[11] Patent Number: 5,754,300
[45] Date of Patent: *May 19, 1998

[54] ALIGNMENT METHOD AND APPARATUS

[76] Inventors: Nobutaka Magome, 5-11-6-106 Shinsaku, Takatsu-ku, Kawasaki, Kanagawa-ken, Japan; Kazuya Ohta, Court Ikegami 107, 25-12 Ikegami 8-Chome, Ohta-ku, Tokyo, Japan; Hiroki Tateno, 1023 Chitose, Takatsu-ku, Kawasaki, Kanagawa-ken, Japan

[*] Notice: The terminal 63 months of this patent has been disclaimed.

[21] Appl. No.: 545,760

[22] Filed: Jun. 28, 1990

Related U.S. Application Data

[63] Continuation of Ser. No. 356,780, May 24, 1989, abandoned.

[30] Foreign Application Priority Data

May 27, 1988 [JP] Japan ................................. 63-128531

[51] Int. Cl.$^6$ .......................................... G01B 11/00
[52] U.S. Cl. .................................. 356/401; 250/548
[58] Field of Search .......................... 356/399, 400, 356/401; 250/548, 559.3; 355/43, 53, 55, 57, 67

[56] References Cited

U.S. PATENT DOCUMENTS 4,600,390 7/1986 Fay ........................................... 356/401
4,626,907 12/1986 Schedewie ............................. 356/401

FOREIGN PATENT DOCUMENTS 61-137013 6/1986 Japan.

*Primary Examiner*—Hoa Q. Pham
*Attorney, Agent, or Firm*—Michael N. Meller

[57] ABSTRACT

An error in alignment between both positions is obtained from reference position information incorporated in advance in an exposure apparatus for manufacturing a semiconductor and detection position information obtained by physically non-contact measuring a mark formed on an object to be measured such as a wafer, a mask or a wafer stage. This mark has a construction having a periodic pattern at a predetermined pitch in connection with a scanning direction. A periodic signal obtained by non-contact scanning the mark is subjected to Fourier integration processing and a phase angle including not only a fundamental wave component but a high-order component by calculation of a sine wave and a cosine component of Fourier conversion to thereby detect position information of an average center position of the mark with a correction of a mark deformation caused by wafer or process of mask added thereto. An error in alignment is corrected by relatively moving said object to a reference position.

13 Claims, 5 Drawing Sheets

FIG. 3
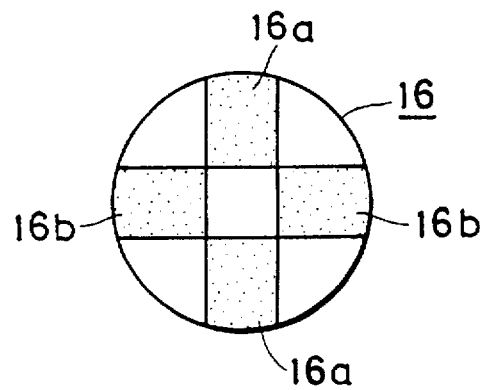
FIG. 4a
FIG. 4b
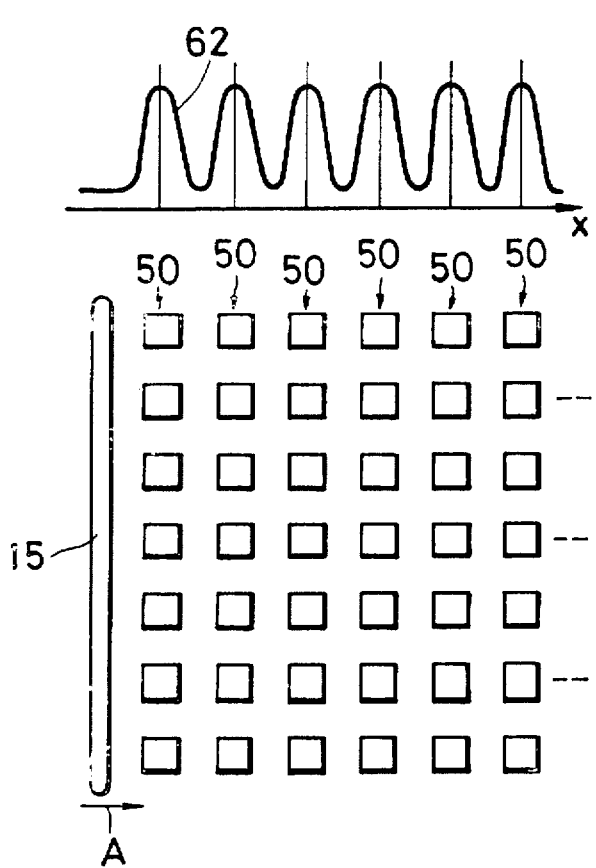
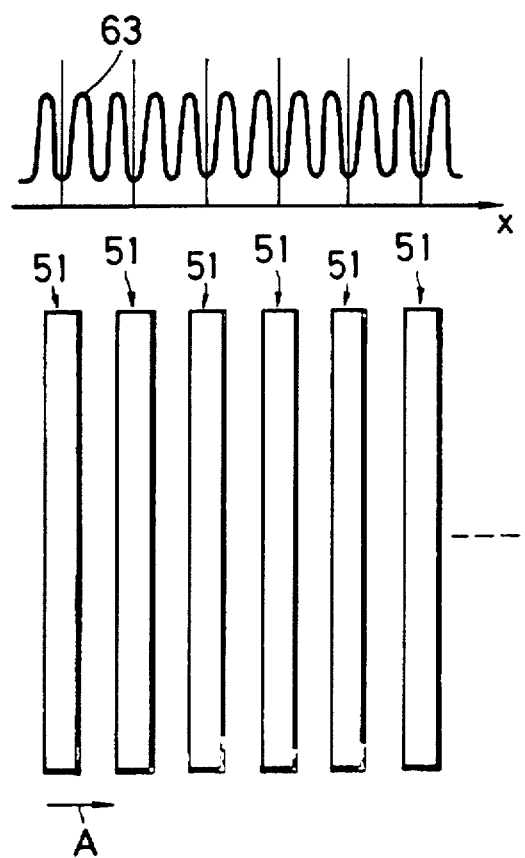

ALIGNMENT METHOD AND APPARATUS

This application is a continuation of application Ser. No. 07/356,780, filed May 24, 1989, now abandoned.

BACKGROUND OF THE INVENTION

1. Field of the Invention

This invention relates to an alignment method and apparatus in a semiconductor manufacturing apparatus and the like.

2. Description of the Prior Art

In the past, in a fine alignment of a wafer or the like in a semiconductor manufacturing apparatus, generally, alignment marks having a predetermined pattern provided in advance on objects such as a wafer, a recticle and the like are relatively scanned by a laser beam to detect a reflecting light, a scattered light or a diffracted light.

As an alternative detection method, bright or dark visual field of a alignment mark is captured by a television camera or CCD array sensor.

In conventional signal processing of these detection signals, for example, an optical signal is converted into an electric signal by means of a photosensor, the obtained electric signal is sliced at a certain level, and the center of the whole signal after sliced is obtained by peak detection to determine the center of a mark. In order to improve the detection rate of marks to avoid an erroneous recognition from other patterns, a mark space is extracted from a position on a time axis of the signal after slicing the signal, registration thereof with a known designed mark space is examined, a mark position of the whole mark is obtained from an average value of individual positions, and reduction in error of alignment is attained by an averaging procedure.

However, in the actual wafers or the like, the shape of individual alignment marks formed on the surface thereof is greatly affected by processings such as deposition, etching and the like in difference of thickness of a resist, and the shape in the vicinity of a difference in level of the mark. Strictly speaking, it has a surface property including individually different proper deformed portions. Accordingly, a phenomenon sometimes occurs that in the signal, a fine noise component corresponding to the aforesaid proper deformation property is superposed to a fundamental wave component corresponding to a designed shape having a mark, and even marks in the vicinity of the same wafer, waveforms of detection signals delicately differ. If alignment is carried out in a conventional method, an error in alignment caused by the noise components occurs. Moreover, in the conventional method, when a slice level is varied, the center position of a detection mark differs, and also in the case where the center position as the whole mark is found from the detection result of a plurality of marks, when a slice level is different with a certain detection mark or a signal amplitude is greatly different, information from the detection mark does not use for detecting a position of the whole mark, and therefore the original averaging effect lowers. Furthermore, in the conventional alignment method, in the case where even if the pitch of marks is constant but the mark space is not dense, there arises a problem in that the merit resulting from the averaging cannot be obtained.

SUMMARY OF THE INVENTION

It is an object of the present invention to provide an alignment method and apparatus which can improve an alignment accuracy by conducting averaging processing of signals taking into consideration noise components based on process deformation of marks included in signals detected by scanning and which can obtain an error in alignment in a short period of time by less calculation frequency without requiring consideration of an error when a peak of signal is detected.

According to the alignment method of this invention, an amount of deviation between both positions, that is, an error in alignment is obtained from reference position information incorporated in advance corresponding to a reference position on a measuring system and detection position information obtained by physically non-contact measuring a periodic mark having a predetermined pitch formed on an object to be measured. In this case, the periodic mark is non-contact scanned in a direction of pitch, whereby a measured signal having a periodicity with respect to the scanning position is obtained. From the obtained periodic measured signals, phase components of Fourier series with a predetermined position of a period in design as a reference are respectively obtained by calculation with respect to a fundamental wave component of a period in design of said mark determined by said predetermined pitch and a high-order component of a period which is one integer thereof, and said alignment error is obtained on the basis of the detection position information of an average center position of the mark including the phase component with respect to the fundamental wave component and the phase component with respect to the high-order component. Finally, the aforesaid object is relatively moved with respect to the aforesaid reference position so as to correct the alignment error.

In other words, in this invention, paying attention to the point that a proper pitch of an alignment mark is known in design in advance and the point that even if individual alignment marks and mark constituting units are changed in size by the processes, the pitch remains unchanged, the pitch space of marks is extracted from a period of a detection signal and averaged by the whole mark to obtain a center position thereof.

That is, in this invention, the relationship between a construction of an alignment mark and a detection scanning direction thereof is determined so that a sine wave periodic signal with respect to a scanning position is obtained as a measured signal by relative scanning. Accordingly, the obtained measured signal can be incorporated into a memory as a function f(x) of a scanning moving amount x or a function f(t) of time t if the scanning rate is determined. In this case, the aforesaid function is a finite periodic function including a fundamental wave component and a high-order component which is one integer thereof and which can be developed to Fourier series. A period T (accordingly, frequency U) of the fundamental wave component is primarily determined by a pitch of alignment marks in the scanning direction, which is known as a set value.

The thus obtained function signals are applied with calculation, and Fourier integration (Fourier conversion) is carried out with respect to a fundamental wave component (i=1) of the period T (accordingly, frequency U) and a high-order component (i=2, 3 . . . ) of a period one integer (accordingly, frequency of integer times), and a phase component $\Phi_i$ (i=1, 2, 3 . . . ) is obtained in accordance with the following equations (1) to (3) from a sine component and a cosine component. Here, the aforementioned moving amount x is shown, but needless to say, also in case of taking time t, equations in the form similar thereto can be used for calculation.

$$S = \int f(x) \cdot \sin 2\pi U \cdot x \cdot dx$$
$$= \Sigma_k f(x_k) \cdot \sin 2\pi (U \cdot x_k)(k=1,2,3 \ldots) \quad (1)$$

$$C = \int f(x) \cdot \cos 2\pi U \cdot x \cdot dx$$
$$= \Sigma_k f(x_k) \cdot \cos 2\pi (U \cdot x_k)(k=1,2,3 \ldots) \quad (2)$$

$$\Phi_f = \tan^{-1}(S/C)(\text{radian}) \quad (3)$$

wherein S represents the sine component of Fourier series of frequency U, C the cosine component thereof, and $\Phi_f$ the phase angle of f(x) with respect to the sine wave in equation (1), k.i being well corrected in the high-order component up to approximately 3 to 4. It is to be noted that the length of $f(x_k)$ is chosen to be equal to integer times of the period T(=1/U), a minimum calculation error is obtained.

Alignment error $\Delta x$ is expressed by the following equation (4).

$$\Delta x = X_o + a_1(\Phi_1/2\pi \cdot U) + a_2(\Phi_2/2\pi \cdot 2U) + a_3(\Phi_3/2\pi \cdot 3U) + \ldots$$
$$= \Sigma_i (a_i \cdot \Phi_i / 2\pi \cdot U \cdot i) + X_o, (i=1,2,3 \ldots) \quad (4)$$

wherein $X_o$ represents the initial offset amount of a mechanical deviation of a measuring system itself, the $X_o$ being measured in advance as a proper value. $a_i$ represents the correction coefficient. This correction coefficient is suitably varied whereby correction with respect to a mark deformation caused by the wafer process to improve the detection accuracy of the mark position.

The sin/cos signals for calculation can be produced within a computer or may be held in a read-only memory (ROM). In the case of the latter (ROM), a variation of frequency U need be taken into consideration, and therefore, ¼ period of a sine wave is subjected to fine sampling and stored, which is thinned-out and read. The cos signal can be removed from the memory with the sin signal displaced by ¼ period. The signal is stored by a portion of <¼ period, and the remaining ¾ period is synthesized to obtain a signal for a period portion.

In this invention, a period (frequency) is known in advance, and correlation with the sine wave is totally integrated within an effective range of the signal by calculation of Fourier conversion and averaged to obtain an alignment error. Therefore, this shows an excellent feature in noise reduction within the all signal.

In the normal correlation calculation, the calculation formula, $U(S) = \int f(x).g(x-s).dx$, is used for averaging by calculation. In this method, integration with the other function g(x) displaced by S with respect to one function f(x) is repeated, and therefore many calculations take place. Then, even if the function g(x) has been originally known to be the period function, integration for one period portion need be done while being displaced.

On the other hand, in the method of this invention, the procedure of Fourier integration is used, and therefore, the phase component thereof, that is, the highest correlation peak position is known by only the integration of the sine and cosine, thus extremely reducing the frequency of calculations to obtain the effect within a short period of time.

In the case of the normal correlation method, it is necessary to finally obtain a peak position, and therefore an alignment error cannot be but obtained at a slice level. However, in this invention, an alignment error is primarily determined by Fourier component.

With respect to the anti-noise property, in a conventional method in which an alignment signal is sliced at a slice level to detect a middle point thereof, an influence of noises can be avoided to some extent by the slicing at a portion where an inclination of a signal waveform is greatest, but such has a limitation. On the other hand, in this invention, the center position of mark is judged on the basis of periodicity and extraction feature of the alignment mark itself, and therefore the method of the invention is particularly strong system for the noises.

In this invention, as measured signals, any signals can be used as long as the period (frequency) of the fundamental wave component which is sine wave as previously mentioned is known. Scanning and detection systems used include various systems such as light beams, electron beams. X-rays, moire stripe detection, electrostatic capacity, magnetic and the like.

In the alignment method according to this invention, a signal subjected to calculation processing has a sine wave, and therefore an error of integer times of a mark pitch cannot be detected. In this case, an object may be positioned in prealignment within approximately ½ of a period of a fundamental wave of a measured signal, and such a prealignment can be sufficiently made in a conventional procedure.

In this invention, the center position of mark is judged on the basis of the periodicity of the alignment mark as previously mentioned. For example, where an amplitude noise is contained in the measured signal, one or both upper and lower amplitude levels in the waveform of the measured signal are clipped by a slicer or the like to replace it to constant, after which a phase component of Fourier series is obtained, so as to avoid of being affected by the amplitude noise. In this case, a slice level may be set on the basis of a noise level in a non-signal level of the measured signal.

Where in this invention, an alignment error is obtained, with respect to a reference position when a measured signal is incorporated, a periodic reference mark provided on the appratus itself such as a fidicial mark on a wafer stage or either periodic alignment mark on an object is measured and position data thereof is obtained by calculation of similar Fourier component, which may be used as reference position data for measuring a mark later on.

According to this invention, in a construction of an alignment mark, a periodic pattern having a predetermined pitch with respect to a scanning direction is used, a periodic signal obtained by scanning is subjected to Fourier integration processing to obtain a phase difference with respect to not only a fundamental wave component but also a high-order component. Therefore, it is hard to be affected by mark deformation caused by processes, and two times of calculation, sine and cosine components will suffice. Processing time is extremely short and correlation may be taken without depending on peak detection, because of which an error caused by a slice level need not be taken into consideration but an alignment error is primarily obtained, thus obtaining excellent effects in terms of both error and calculation time.

In this invention, a periodic pattern of an alignment mark is obtained, by scanning it, according to characteristics of an alignment detection system (in a laser beam, width in a measuring direction; in a television camera, resolution thereof; and in a diffraction grating system, a beam open angle) so as to obtain a measured signal having a waveform close to a sine wave. Since a mark pitch of such pattern is generally sufficiently short, unevenness in coating of resist on the mark is inevitably decreased, bringing forth an incidental merit in that a pseudo-signal caused thereby is hard to occur.

The above and other objects and merits of the present invention will be understood more clearly from the ensuing description of the embodiments in connection with the accompanying drawings.

BRIEF DESCRIPTION OF THE DRAWINGS

FIG. 3 is an explanatory view showing a structural example of a light receiving portion of an alignment detector;

FIGS. 4a and 4b are respectively explanatory views showing essential parts of an alignment mark having a periodic pattern formed in accordance with this invention;

DESCRIPTION OF THE PREFERRED EMBODIMENTS

The present invention will now be described in connection with an embodiment in which the invention is applied to a projection exposure apparatus for manufacturing a semiconductor.

Figure 1:
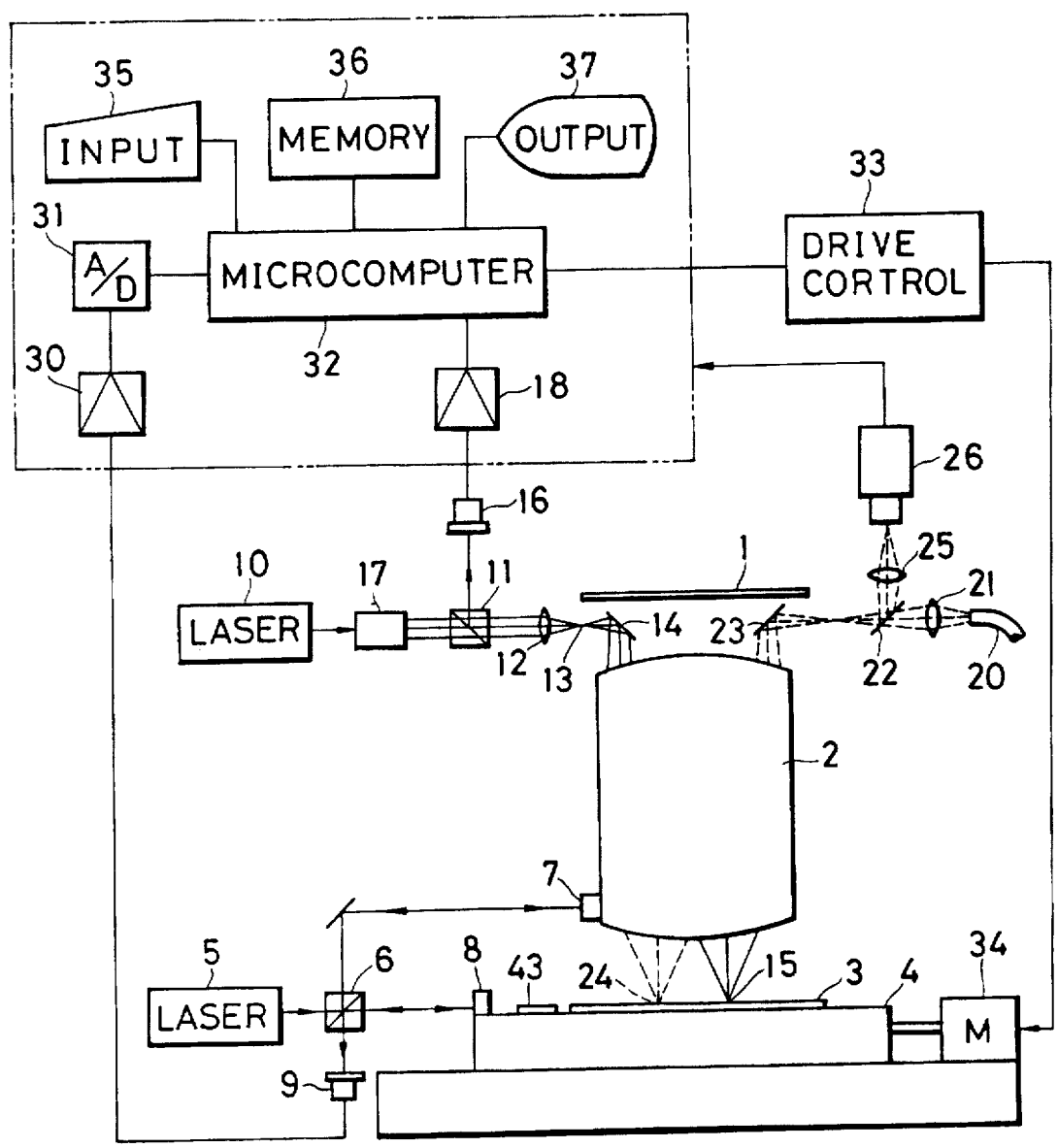
FIG. 1 is an explanatory view showing a structural example of an alignment optical system of a semiconductor exposure apparatus to which an alignment method of this invention can be applied.

FIG. 1 shows a main structure of an optical system of a projection exposure apparatus for manufacturing a semiconductor used to carry out this invention. In FIG. 1, a reticle 1 is illuminated from the top by an illumination system not shown, and a pattern of the reticle is formed by a projection lens 2 on the surface of a wafer 3 on a stage 4. Such an exposure is repeated along with movement of the stage within a horizontal plane to effect exposure of a step and repeat system. A position of the stage 4 is always monitored by a laser interferometer (a laser 5, a beam splitter 6, a mirror 7 on the stationary side, a mirror on the moving side, and a photoelectric detector 9), and an output of the detector 9 of the interferometer is converted into a pulse signal of one pulse per 0.02 µm, for example, by an A/D converter (such as a pulsating circuit) 31 through an amplifier 30 and applied to a microcomputer 32. The microcomputer 32 controls a drive controller 33 for a motor 34 for moving the stage 4 on the basis of an output of the interferometer to control a position of the stage 4 with accuracy of approximately 0.2 µm. While in the figure, the stage moving system has been shown merely with respect to one of rectangular coordinates within a horizontal plane, it is needless to mention that a further similar system including a laser interferometer and a stage moving motor is provided for the other coordinate.

A pulse signal from the laser interferometer comprises a position pulse representative of a position corresponding to the movement of the stage 4. This position pulse is also utilized to subject an alignment signal to sampling to incorporate it into a memory 36 as will be described later. Numeral 35 denotes an input device such as a keyboard connected to the microcomputer 32, and numeral 37 denotes an output device such as a CRT display.

The alignment mark detection system comprises, for example, an optical system including a laser 10 and a photo-electric detector 16 and is in the form of a dark visual field detection system in which a beam from the laser 10 is formed into a split-like beam by a cylindrical lens system 17, after which an elongate beam spot 15 is applied on a wafer 3 by means of a projection lens 2 through a beam splitter 11, a relay lens 12, and a mirror 14, a light scattered and diffracted with an edge difference in level of an alignment mark on the wafer is returned through the projection lens 2 and separated by the beam splitter 11, and a positive reflected light is cut at a position conjugated with an eye of the projection lens 2. This detection signal is subjected to sampling by the aforementioned position pulse by the microcomputer 32 through the amplififer 18 and then incorporated in the form of a signal waveform along the stage position into the memory 36.

The alignment mark will be described below.

Figure 2:
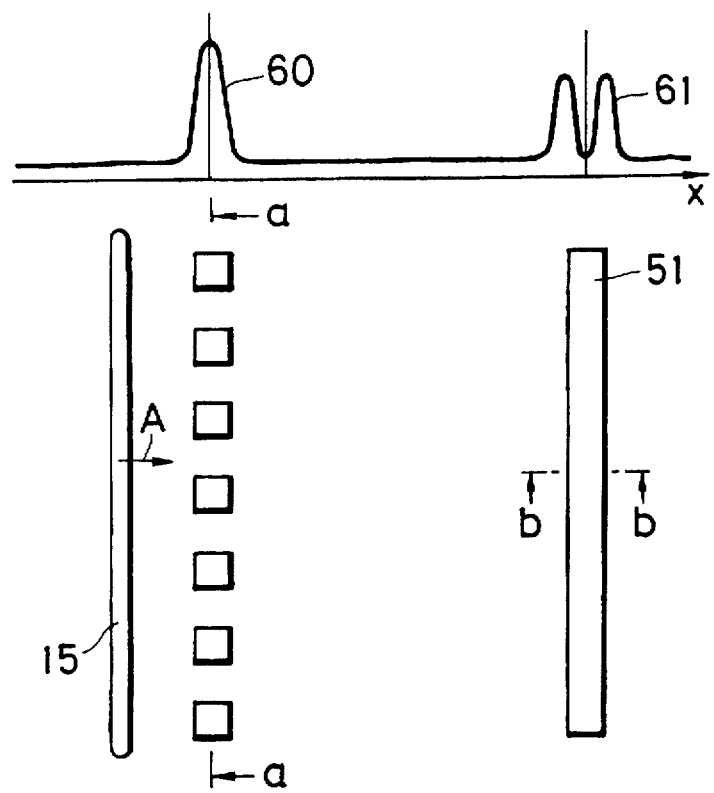
FIG. 2 is an explanatory view showing the corresponding relationship between the shape of an alignment mark and the signal waveform.

FIG. 2 shows a plane pattern of an alignment mark correspondingly to a signal waveform outputted from the photoelectric detector 16 when said plane pattern is crossed by the elongate beam spot 15.

Figures 2A, 2B:
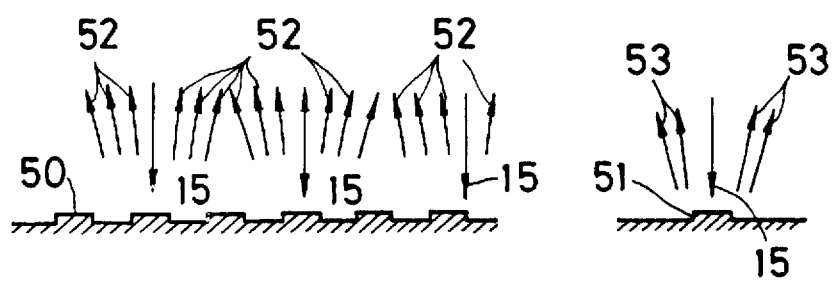
FIG. 2a is an explanatory view taken on line a—a of FIG. 1.
FIG. 2b is an explanatory view taken on line b—b of FIG. 1.

In FIG. 2, alignment marks 50 comprises a row of dot-like patterns formed in the form of concave-convex on the wafer 3. When the beam spot 15 parallel to the direction of said row relatively moves in a direction as indicated by arrow A to cross them, a single peak signal as shown by a waveform 60 is outputted from the photoelectric detector 16. This results from the fact that as shown in FIG. 2a, as viewed from the section a-a of the wafer, the dot-like concavo-convex just functions as a diffraction grating, and when the beam spot 15 and the mark 50 are superposed to each other, diffraction lights 52 are produced in the row direction of the marks, which form a single peak.

On the other hand, in the case of an alignment mark 51 having a slit-like continuous elongate pattern, a signal having two mountainous peaks as shown by waveforms 61 is outputted from the photoelectric detector 16 by the passage of the similar beam spot 15. This results from the fact that as shown in FIG. 2, as viewed from the section b—b of the wafer, scattering lights 53 at a difference in level in both edges widthwise of the mark 51 form two peaks.

Since the elongate beam spot 15 in the form of a laser beam is used in the alignment optical system, the scattered and diffracted lights are incident upon the photoelectric detector 16 for detection of the dark visual field, that is, they are separated in the direction perpendicularly to each other within the eye conjugate plane. Therefore, on the light receiving surface of the detector 16, there are provided two sets of photoelectric conversion elements 16a and 16b arranged in a direction perpendicularly to each other as shown in FIG. 3.

A further example of the alignment optical system comprises a system for detecting a dark visual field image using an illumination by an optical fiber 20 and a television camera 26. In this case, the illuminating light from the optical fiber 20 passes through a lens 21, a half miror 22 and a mirror 23 in that order to evenly irradiate a local area including a mark on the wafer 3 through the projection lens 2 at a spot 24. When the alignment marks 50 and 51 are positioned in the aforesaid illuminated area, the dark visual field image (an image formed by the scattered and diffracted light) is detected by the television camera 26 through the lens 25. At this time, an image signal from the television camera 26 has a waveform similar to that of FIG. 2.

In this invention, a plurality of alignment marks 50 and 51 are arranged periodically at a predetermined pitch in a scanning direction of the beam spot 15. That is, as shown in FIG. 4a, a plurality of alignment marks 50 in which dot-like patterns are arranged in a longitudinal row are arranged periodically at a predetermined pitch in a scanning direction (arrow A) of the beam spot 15, and by scanning the beam spot 15 in a direction as indicated by arrow A, a sine wave (pseudo sine wave) signal as shown by a waveform 62 is obtained from the photoelectric detector 16. Further, as shown in FIG. 4b, a plurality of slit-like alignment marks 51 are arranged at a predetermined pitch in a direction as indicated by arrow A, and a half-period sine wave signal as shown by a waveform 63 is obtained from the photoelectric detector 16 by the scattered light at both edges of each of the slit-like marks 51.

Such sine wave measured signals are subjected to sampling by a stage position pulse caused by the laser interferometer 5 and stored in a memory 36, and calculation of the aforementioned equations (1), (2), (3) and (4) is executed by a microcomputer 32.

In the alignment of the reticle 1 and the wafer 3, it is necessary to measure in advance the distance (base line) between a position wherein the center of the reticle 1 is projected on the wafer stage 4 and a position measured on the wafer 3 in accordance with the present invention.

Figure 5:
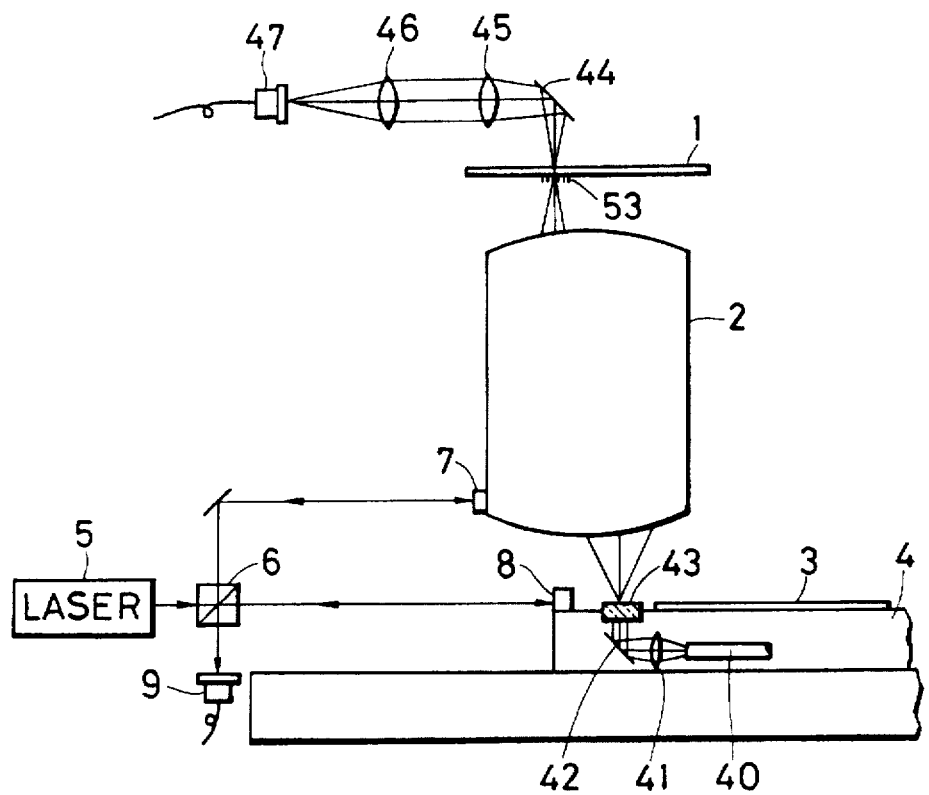
FIG. 5 is an explanatory view showing a detection system of a reference mark on a stage.
Figure 6:
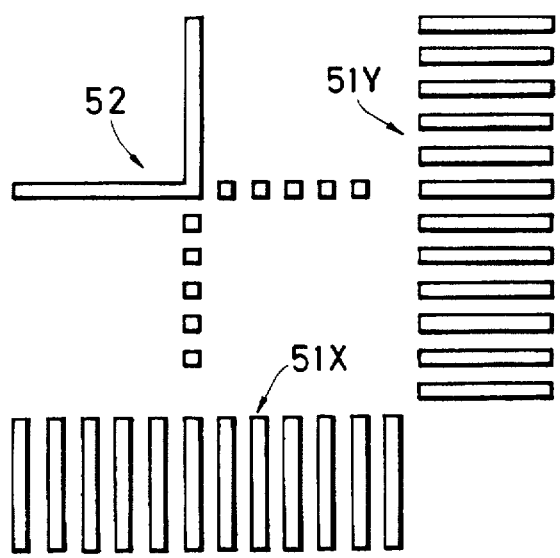
FIG. 6 is an explantory view showing one example of a pattern of a reference mark.

To this end, for example, light which is the same as or very close to the exposed light is introduced into the stage 4 by the optical fiber 40 as shown in FIG. 5, and a reference mark 43 on the stage is illuminated from the interior of the stage through a lens 41 and a mirror 42. The reference mark 43 is obtained by patterning chrome (Cr) on the surface of a quartz plate which is hard to be deformed by heat, and is fixedly arranged on substantially the same plane as the wafer 3. The shapes of the reference mark 43 include one in the form of a diffraction grating in XY direction as shown in FIG. 6 and one in which a cross-like auxiliary mark 52 for precisely measuring position combined with 51X and 51Y, and a reference mark 53 having the same shape with a size changed by a magnification portion of the projection lens is provided on the pattern surface of the reticle 1.

Figure 7:
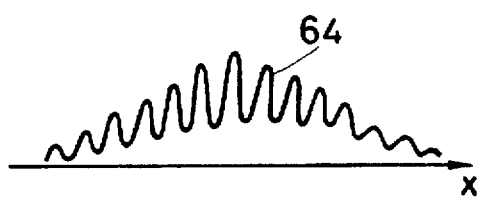
FIG. 7 is a diagram showing a waveform of a reference mark detection signal.

The reference mark 43 is illuminated from the bottom from the optical fiber 40 through the lens 41 and the mirror 42, and is superposed to the reference mark 53 of the reticle 1 through the projection lens 2 along with movement of the state 4 and detected by a detection system above the reticle 1. The light having passed through the reference mark 53 of the reticle 1 is detected by the photoelectric detector 47 through the mirror 44, the lenses 45 and 46. The waveform of the detection signal is a correlation waveform as shown in FIG. 7 by the diffraction grating of both the reference marks 43 and 53, and by signal processing utilizing Fourier conversion by the microcomputer 32, a projection image of the reticle mark 53 is obtained at the relative wafer stage coordinate. For sampling of data in this case, a coordinate position pulse detected by the photoelectric detector 9 of the laser interferometer is used. In this manner, the reticle position is relatively obtained at the wafer stage coordinate, which is stored in the memory 36.

Next, the reference mark 43 on the stage is measured by a wafer sensor in the form of the photoelectric detector 16, and the detection position thereof is stored, as information for the measured reference position represented by the wafer stage coordinate, in the memory 36.

A difference between these two positional informations stored in the memory 36 in the manner as described above provides the aforesaid base line, and a positional deviation within ½ pitch using the alignment marks (FIGS. 4a and 4b) on the wafer 3 is measured as previously mentioned and is fed to the wafer stage in addition to the base line, then the wafer and the reticle are superimposed through the projection lens 2.

The procedure for measuring the position of the mark in the alignment method according to the present invention can be utilized, as the other application, for measuring a distortion of the projection lens. In this case, marks having a pattern as shown in FIG. 6 are distributed on the reticle corresponding to points in which distortion is to be measured. It is necessary to know mark positions on the reticle as correct as possible, and accordingly, a cross-like auxiliary mark 52 for correct measurement of coordinates is important.

A series of sine wave signals, which are obtained by exposing the aforesaid mark pattern to a resist coated on the wafer using the reticle and scanning diffraction grating-like patterns 51X and 51Y, are processed by Fourier conversion procedure to obtain a difference in space between the marks to measure a distortion.

In the present invention, since there is a limit that a distortion amount AX computed from a phase angle obtained by Fourier conversion is within one wavelength of the sine wave signal, an alignment error or distortion in excess of one wavelength is not measured, but there arises no problem if the auxiliary mark 52 is measured by normal peak detection and the measurement within one wavelength of the sine wave is conducted in advance by the laser interferometer 5.

In the case where the photoelectric detector 16 of the alignment system comprises one having two sets of photoelectric conversion elements 16a and 16b perpendicular to each other as shown in FIG. 3, if detection signals are separately removed from the photoelectric conversion elements 16a and 16b, dot-like marks (grating marks) 50 as in FIG. 4a and slit-like marks (bar marks) 51 as in FIG. 4b can be separately detected as separate detection signals. By utilizing this, the row of one marks can be first detected so as to control the start of sampling measured signals of periodic patterns of the other marks next thereto. As previously mentioned, it is effective to clip the measured signal waveforms at a certain level or slice them.

Figure 8A:
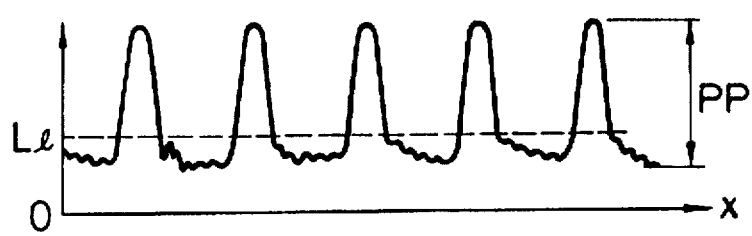
FIGS. 8a and 8b are respectively diagrams showing the status of strain of signal waveforms.
Figure 8B:
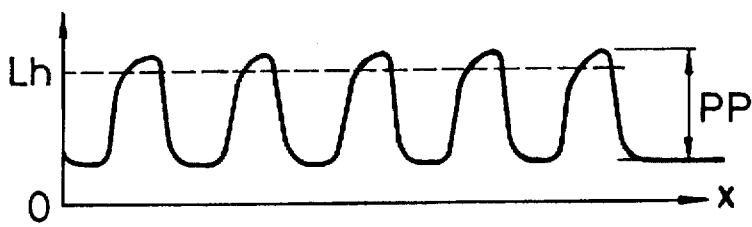

A distortion possibly occuring in the signal waveform will be briefly described with reference to FIGS. 8a and 8b. FIG. 8a shows a distortion waveform which tends to occur in the case where the marks 50 and 51 are formed to be projected in a fine amount to the wafer surface as shown in FIGS. 2a and 2b, in which case there is a great tendency that noises are superimposed to a portion of a root in the waveform. FIG. 8b shows a distortion waveform which tends to occur in the case where the marks 50 and 51 are formed to be depressed by a fine amount with respect to the wafer surface, in which case there is a great tendency that mountaineous portions in the waveform are asymmetrical to left and right. In most cases, these distortions result from an influence of a photosensitive layer (a resist having a thickness of 1 to 2 μm) coated on the marks 50 and 51.

Figure 8C:
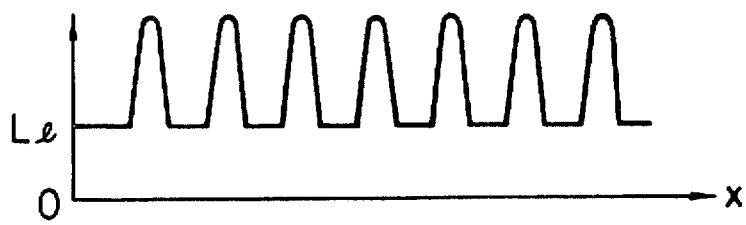
FIG. 8c is a diagram showing a signal waveform after the strain has been corrected.

In view of the above, a peak to peak value PP of the signal waveform is obtained in consideration of a difference between the measured signal waveform and the concavo-convex of the marks, and in the case of FIG. 8a, a signal is clipped at a suitable level LA from the lower portion (bottom) of the value PP to approximately 33% to provide a fixed amplitude value and shaped to a waveform as shown in FIG. 8c, after which calculation of the equations (1), (2) and (3) may be conducted.

In the case of FIG. 8b, a signal from an upper portion (peak) of value PP to approximately 33% is clipped at a level Lh to arrange it to a fixed amplitude value.

These clip levels LA and Lh can be set in a manner of software and can be processed in a manner of hardware. In the case of the software, the sampling value of the incorporated waveform is replaced by a fixed value, whereas in the case of the hardware, an offset voltage to an analog amplifier may be varied to overflow an amplitude of signal to a high level side or a low level side or both high and low levels.

What is claimed is:

1. In an alignment method for moving an object to be measured so as to correct an alignment error between a reference position on a measuring system and an average center position of a periodically structured mark formed with a predetermined pitch on said object, said alignment error being calculated from reference position information obtained in advance corresponding to said reference position and detection position information obtained by measuring said said periodic mark by means of laser scanning in a direction of a pitch thereof to obtain a measured signal having a periodicity with respect to a scanning position, wherein said center position is determined by the method comprising:

calculating, on the one hand, Fourier sine component and Fourier cosine component with respect to both a fundamental wave component and a harmonic component of a period determined by said predetermined pitch in connection with the obtained measured signal and calculating on the other hand, respective Fourier phase components from both said Fourier sine component and Fourier cosine component with reference to a predetermined position in said period to obtain said detection position information of said average center position of said mark including both the phase components of said fundamental wave component and said harmonic component.

2. The alignment method according to claim 1, wherein said calculation step is carried out after said measured signal has been clipped at a predetermined amplitude level width.

3. In a mark position detecting apparatus for detecting a periodically structured mark formed with a predetermined pitch on an object to be measured on the basis of a scanning movement amount of said object from a reference position previously obtained on a measuring system, the position of said mark being scanned while moving said object within a scanning plane, the apparatus comprising:

laser means for scanning said periodic mark in a direction of a pitch thereof to obtain a measured signal having a periodicity with respect to a scanning position; and calculation means for calculating, on the one hand, Fourier sine component and Fourier cosine component with respect to both a fundamental wave component and harmonic component of a period determined by said predetermined pitch in connection with the obtained measured signal and, on the other hand, respective Fourier phase components from both said Fourier sine component and Fourier cosine component with reference to a predetermined position in said period to obtain detection position information of an average center position of said mark from the result of said calculation including both the phase components of said fundamental wave component and said harmonic component.

4. The apparatus accordimg to claim 3, further comprising means for clipping said measured signal at a predetermined amplitude level to remove an amplitude noise.

5. The apparatus according to claim 3, including a periodic reference mark directly provided on a measuring system within the same plane as a scanning surface of said object to be measured.

6. In an alignment apparatus for correcting an alignment error between a reference position on a measuring system and an average center position of a periodically structured mark formed with a predetermined pitch on an object to be measured said object being held on a movable stage of said system, said alignment error being calculated from reference position information obtained in advance corresponding to said reference position and detection position information obtained on the basis of a movement amount of said stare from said reference position using laser means for scanning said periodic mark while moving said object within a scanning plane in said stage, to obtain a measured signal having a periodicity with respect to a scanning position comprising:

calculation means for calculating, on the one hand, Fourier sine component and Fourier cosine component with respect to both a fundamental wave component and harmonic component of a period determined by said predetermined pitch in connection with the obtained measured signal and, on the other hand, respective Fourier phase components from both said Fourier sine component and Fourier cosine component with reference to a predetermined position in said period to obtain detection position information of the center position of said mark from the result of said calculation including both the phase components of said fundamental wave component and said harmonic component; and means for moving said stage relative to said reference position so as to correct said alignment error.

7. The apparatus accordimg to claim 6, further comprising means for clipping said measured signal at a predetermined amplitude level to remove an amplitude noise.

8. The apparatus according to claim 6, having a periodic reference mark directly provided on the measuring system within the same plane as the scanning surface of said object to be measured.

9. A method for aligning a substrate by measuring an error in the alignment of the substrate with respect to a reference position in which a periodic mark formed on said substrate is scanned by a measuring means, and in which a measured signal of a periodic wave is generated from said measuring means corresponding to periodic changes in the pitch direction of said periodic mark, wherein said periodic mark is pre-determined by analyzing phase data of said measured signal, and wherein said substrate is aligned based on said error in alignment comprising the steps of:

recording a wave of said measured signal with periodical changes in magnitude, corresponding to the scanning position or time;

calculating a fundamental sine component by Fourier integrating sine wave data which corresponds to a basic period of said periodic mark and measured wave data which corresponds to said recorded measured signal wave, and at the same time calculating a fundamental cosine component by Fourier integrating cosine wave data which corresponds to a basic period in said periodic mark, and said measured wave data, to calculate a fundamental phase component of said measured signal, based on the ratio of said fundamental cosine component to said fundamental sine component;

calculating a harmonic sine component by Fourier integrating the harmonic sine wave data which corresponds to 1/integer period of a basic period of said periodic mark and said measured wave data, and at the same time calculating a harmonic cosine component by Fourier integrating the harmonic cosine wave data which corresponds to a 1/integer period of a basic period of said periodic mark and said measured wave data, to calculate a harmonic phase component of said measured signal based on the ratio of said harmonic cosine component to said harmonic sine component; and calculating the error in said alignment, based on both said fundamental phase component and said harmonic phase component.

10. A method for aligning a substrate by measuring an error in alignment with respect to a reference position, in which a periodic mark formed on said substrate is scanned by a measuring means, and in which a measured signal of a periodic wave is generated from valid measuring means corresponding to periodic changes in the pitch direction of said periodic mark wherein said periodic mark is predetermined by analyzing phase data of said measured signal, and wherein said substrate is aligned based on said error in alignment comprising the steps of:

forming a clamp signal wave of which the peak or bottom of the wave corresponds to said measured signal output through said measurement means which periodically changes in magnitude corresponding to scanning position or time;

calculating an n-order sine component, when n is an integer, by Fourier integrating the n-order sine wave data which corresponds to 1/n period of a basic period of said periodic mark and data which corresponds to said clamp signal wave, and at the same time calculating an n-order cosine component by Fourier integrating the n-order cosine wave data which corresponds to 1/n period of a basic period of said periodic mark and data which corresponds to said clamp signal wave, in order to calculate phase data which corresponds to the n-order periodic phase component of said measured signal, based on the ratio of the n-order sine component to the n-order cosine component; and calculating the error in alignment of said periodic mark, based on said calculated phase data.

11. An alignment method according to claim 10, wherein the height of said clamp signal wave is controlled by clamping the wave at a predetermined level.

12. An alignment method according to claim 11, wherein said phase data is calculated corresponding to each order of said n-order periodic phase component and wherein said error in alignment calculated based on the calculated phase data corresponding to each other.

13. An alignment method according to claim 12 in which integers from 1 through 3 are defined as each order in the calculation of said phase data.

* * * * *

UNITED STATES PATENT AND TRADEMARK OFFICE
CERTIFICATE OF CORRECTION

PATENT NO. : 5,754,300
DATED : May 19, 1998
INVENTOR(S) : Magome et al.

It is certified that error appears in the above-identified patent and that said Letters Patent is hereby corrected as shown below:

On the title page, insert item [73] Assignee:
Nikon Corporation
Shinagawa, Japan --.

Signed and Sealed this

Seventh Day of December, 1999

Attest:

Q. TODD DICKINSON

*Attesting Officer*    *Acting Commissioner of Patents and Trademarks*